US008665590B2

(12) United States Patent
Wang

(10) Patent No.: US 8,665,590 B2
(45) Date of Patent: Mar. 4, 2014

(54) SERVER RACK

(75) Inventor: Shi-Feng Wang, Shanghai (CN)

(73) Assignee: Inventec Corporation, Taipei (TW)

( * ) Notice: Subject to any disclaimer, the term of this patent is extended or adjusted under 35 U.S.C. 154(b) by 214 days.

(21) Appl. No.: 13/366,844

(22) Filed: Feb. 6, 2012

(65) Prior Publication Data
US 2013/0063887 A1     Mar. 14, 2013

(30) Foreign Application Priority Data

Sep. 8, 2011  (CN) .......................... 2011 1 0267856

(51) Int. Cl.
*G06F 1/20*     (2006.01)
*H05K 7/20*     (2006.01)

(52) U.S. Cl.
USPC .................. 361/679.48; 361/695; 312/236

(58) Field of Classification Search
USPC .................. 361/679.48–679.51, 694–695; 312/223.2, 236; 415/60–61, 213.1, 415/214.1, 220
See application file for complete search history.

(56) References Cited

U.S. PATENT DOCUMENTS

| | | | | |
|---|---|---|---|---|
| 6,236,564 B1 * | 5/2001 | Fan | ............................... | 361/695 |
| 6,406,257 B1 * | 6/2002 | Houdek | ..................... | 415/213.1 |
| 6,616,525 B1 * | 9/2003 | Giraldo et al. | ................ | 454/184 |
| 6,961,248 B2 * | 11/2005 | Vincent et al. | ................ | 361/796 |
| 7,411,788 B2 * | 8/2008 | Liang | ............................ | 361/695 |
| 8,120,910 B2 * | 2/2012 | Hong | ............................. | 361/695 |
| 2004/0120114 A1 * | 6/2004 | Feldmeyer | ...................... | 361/695 |
| 2005/0280990 A1 * | 12/2005 | Goodenough et al. | ......... | 361/695 |
| 2011/0255238 A1 * | 10/2011 | Tan | .......................... | 361/679.48 |
| 2012/0145257 A1 * | 6/2012 | Li | .................................. | 137/215 |
| 2012/0262864 A1 * | 10/2012 | Wang et al. | ................. | 361/679.4 |
| 2013/0063888 A1 * | 3/2013 | Wang | ...................... | 361/679.48 |
| 2013/0065501 A1 * | 3/2013 | Wang | ............................ | 454/184 |
| 2013/0109288 A1 * | 5/2013 | Tang | ............................. | 454/184 |
| 2013/0155608 A1 * | 6/2013 | Tang | ........................ | 361/679.48 |

* cited by examiner

*Primary Examiner* — Robert J Hoffberg
(74) *Attorney, Agent, or Firm* — CKC & Partners Co., Ltd.

(57) ABSTRACT

A server rack includes a rack body and fan modules. The rack body has front and back surfaces. Server units are disposed in the rack body. The fan modules are arranged on the back side along a vertical direction. Each fan module corresponds to several server units and includes a fan case and fan units. The fan case assembled to the back side is independently electrically connected to the rack body and suitable for being independently detached from the rack body. The fan units are detachably assembled to the fan case and arranged on the fan case along a horizontal direction. Each fan unit is independently electrically connected to the fan case and suitable for being independently detached from the fan case along a first direction perpendicular to the back surface or independently assembled to the fan case along a second direction opposite to the first direction.

14 Claims, 9 Drawing Sheets

SERVER RACK

CROSS-REFERENCE TO RELATED APPLICATION

This application claims the priority benefit of Taiwan application serial no. 201110267856.1, filed Sep. 8, 2011. The entirety of the above-mentioned patent application is hereby incorporated by reference herein and made a part of this specification.

BACKGROUND OF THE INVENTION

1. Field of the Invention

The invention relates to a server rack. Particularly, the invention relates to a server rack including fan units.

2. Description of Related Art

A server is a core computer in a network system used for serving various computers, which can provide functions such as storage and print service for network users, and provide clients to share various resources within the network environment. A basic structure of the server is approximately the same to a general personal computer, which is composed of a central processing unit (CPU), a memory and an input/output (I/O) device, etc., and the devices are connected through a bus. A north bridge chip is used to connect the CPU and the memory, and the I/O device is connected through a south bridge chip. A chassis structure of the server has three evolution stages from earlier tower chassis to rack mount chassis stressing centrality, and then blade servers of high-density calculation.

Taking a rack mount server as an example, the rack mount server is a server with an appearance designed according to uniform standards, which is used in collaboration with a cabinet. The rack mount server can be regarded as a tower server with an optimized structure, and a design principle thereof is to reduce a space occupation of the server as far as possible. Many professional network devices apply the rack mount structure, and have a flat shape as that of a drawer, for example, switches, routers and hardware firewalls, etc. A width of the rack mount server is 19 inches, and a height thereof applies a unit of U (1U=1.75 inches=44.45 mm), and the servers generally comply with standards of 1U, 2U, 3U, 4U, 5U or 7U.

The size of the cabinet also complies with a common industrial standard, which is generally between 22U and 42U. The cabinet includes a detachable sliding rack according to the height thereof, and the user can flexibly adjust the height according to a height of the server, so as to store network devices such as a server, a hub and a disk array, etc. After the server is settled, the I/O lines thereof are all led out from the rear of the cabinet (all interfaces of the rack mount server are also located at the rear of the cabinet), and are uniformly disposed in a cable slot of the cabinet, and are attached with labels to facilitate management.

Generally, fans of the conventional rack mount server are not independently assembled to a rack respectively, which is of no avail for quick detaching and maintenance. Moreover, the fans of the conventional rack mount server are not electrically connected to the rack independently, and independent hot-plug thereof cannot be implemented, so that when a single fan is repaired, the other fans are all stopped, which causes inconvenience.

SUMMARY OF THE INVENTION

The invention is directed to a server rack, in which fan units are capable of being independently detached and repaired or replaced.

The invention provides a server rack including a rack body and a plurality of fan modules. The rack body has a front side and a back side opposite to each other. A plurality of server units are disposed in the rack body. The fan modules are arranged on the back side along a vertical direction. Each of the fan modules is aligned to several of the server units and includes a fan case and a plurality of fan units. The fan case is detachably assembled to the back side of the rack body. The fan case is independently electrically connected to the rack body and suitable for being independently detached from the rack body. The fan units are detachably assembled to the fan case and arranged on the fan case along a horizontal direction. Each of the fan units is independently electrically connected to the fan case and suitable for being independently detached from the fan case along a first direction perpendicular to the back surface or being independently assembled to the fan case along a second direction opposite to the first direction.

In an embodiment of the invention, each of the fan cases has a plurality of containing recesses or cavities, and the fan units are respectively disposed for retention in the containing recesses or cavities.

In an embodiment of the invention, each of the fan units has an elastic piece, the fan unit is position-limited in the containing recess or cavity through a structural interference between the elastic piece and the fan case, and the elastic piece is adapted to be deformed due to an external force to release the structural interference between the elastic piece and the fan case, so that the fan unit is adapted to be detached from the fan case.

In an embodiment of the invention, each of the containing recesses or cavities has a locking slot, the elastic piece has a bump, and the bump is buckled to the locking slot to form the structural interference between the elastic piece and the fan case.

In an embodiment of the invention, one end of each of the fan cases has a plurality of lugs, and another end thereof has a plurality of connector tabs, each of the lugs is inserted into the rack body along a direction parallel to the back surface, and each of the connector tabs is fixed to the rack body.

In an embodiment of the invention, the rack body has a plurality of position-limiting slots at the back surface, and each of the lugs is inserted into the corresponding position-limiting slot along the direction parallel to the back surface.

In an embodiment of the invention, each of the connector tabs is screw-locked to the rack body along a direction perpendicular to the back surface.

In an embodiment of the invention, each of the fan units includes a casing and a fan body. The casing is detachably assembled to the fan case, and the fan body is disposed in the casing.

In an embodiment of the invention, the fan case has a plurality of first connectors, the casing has a connector tab and a second connector, the second connector is fixed to the connector tab, the casing is suitable for being detached from the fan case along the first direction, or being assembled to the fan case along the second direction so that the second connector is connected to the first connector along the second direction.

In an embodiment of the invention, the casing has a lifting portion, and the lifting portion is suitable for being stressed along the first direction to drive the casing to detach from the fan case along the first direction.

In an embodiment of the invention, each of the fan modules further includes a plurality of sealing strips, which are disposed at periphery of the fan case to seal fissures between the fan case and the rack body.

In an embodiment of the invention, the server rack further includes a plurality of active flap devices, which are respectively assembled to the fan case to face to internal of the rack body.

In an embodiment of the invention, each of the fan cases has a plurality of air outlets, and the air outlets are respectively aligned to the fan units, the active flap devices respectively correspond to the air outlets, and each of the active flap devices is suitable for being opened and closed to expose the corresponding air outlet or shield the corresponding air outlet.

In an embodiment of the invention, the fan case has a first circuit board and two second circuit boards. The first circuit board is electrically connected to the rack body for communicating with the rack body and generating a communication signal. The second circuit boards are electrically connected to the first circuit board for receiving the communication signal of the first circuit board, where when each of the fan units is independently assembled to the fan case along the second direction, each of the fan unit is independently electrically connected to the corresponding second circuit board along the second direction.

According to the above descriptions, the fan case is detachably assembled to the back surface side of the rack body and is electrically connected to the rack body independently, and each of the fan units is detachably assembled to the fan case and is electrically connected to the fan case independently. In this way, the fan case can be independently detached from the rack body to implement hot-plugging, and each of the fan units can be independently detached from the fan case to implement hot-plugging. When the fan case or the fan unit is independently detached or hot-plugged, operations of the other fan units are not influenced, so that assembling/disassembling and maintenance convenience are improved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
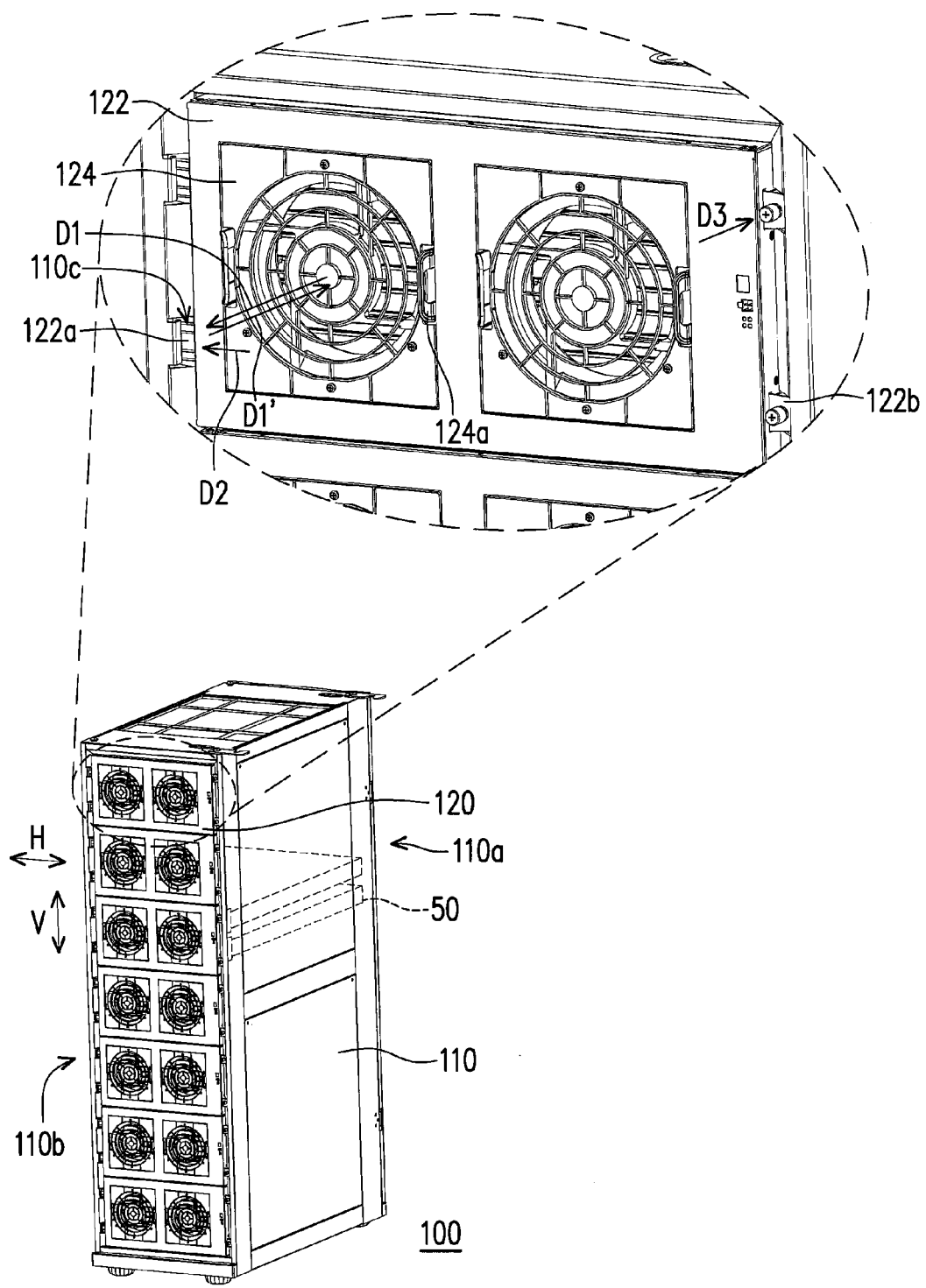
FIG. 1 is a three-dimensional view of a server rack according to an embodiment of the invention.

FIG. 1 is a three-dimensional view of a server rack according to an embodiment of the invention. Referring to FIG. 1, the server rack 100 of the embodiment includes a rack body 110 and a plurality of fan modules 120. A plurality of server units 50 are disposed in the rack body 110 (only two server units 50 are schematically illustrated). The rack body 110 has a front side 110a and a back side 110b opposite to each other. The fan modules 120 are arranged on the back side 110b of the rack body 110 along a vertical direction V. Each of the fan modules 120 is aligned to several of the server units 50 (only two server units 50 are schematically illustrated), so as to dissipate heat generated by the server units 50 or other components in the server rack 100.

In detail, each of the fan modules 120 includes a fan case 122 and a plurality of fan units 124 (two fan units are schematically illustrated). The fan case 122 is detachably assembled to the back side 110b of the rack body 110. The fan case 122 is electrically connected to the rack body 110 independently and is suitable for being detached from the rack body 110 independently. The fan units 124 are detachably assembled to the fan case 122 and arranged on the fan case 122 along a horizontal direction H. Each of the fan units 124 is electrically connected to the fan case 122 independently and is suitable for being detached from the fan case 122 along a direction D1 perpendicular to the back side 110b independently or being assembled to the fan case 122 along a direction D1' opposite to the direction D1 independently.

According to the above configuration, the fan modules 120 are disposed on the back side 110b of the rack body 110 other than being disposed in the rack body 110, so that sizes of the fan modules 120 are not limited, and large-size fans with a good cooling effect can be used to improve a cooling efficiency. Moreover, since the large-size fans have a better cooling efficiency, a lesser number of fans can be used to achieve a certain cooling effect, so that equipment cost is saved. In addition, the fan case 122 is detachably assembled to the rack body 110, and the fan units 124 are detachably assembled to the fan case 122, so that the fan module 120 is suitable for hot-plugging, and assembling/disassembling and maintenance thereof can be easier.

Figure 2:
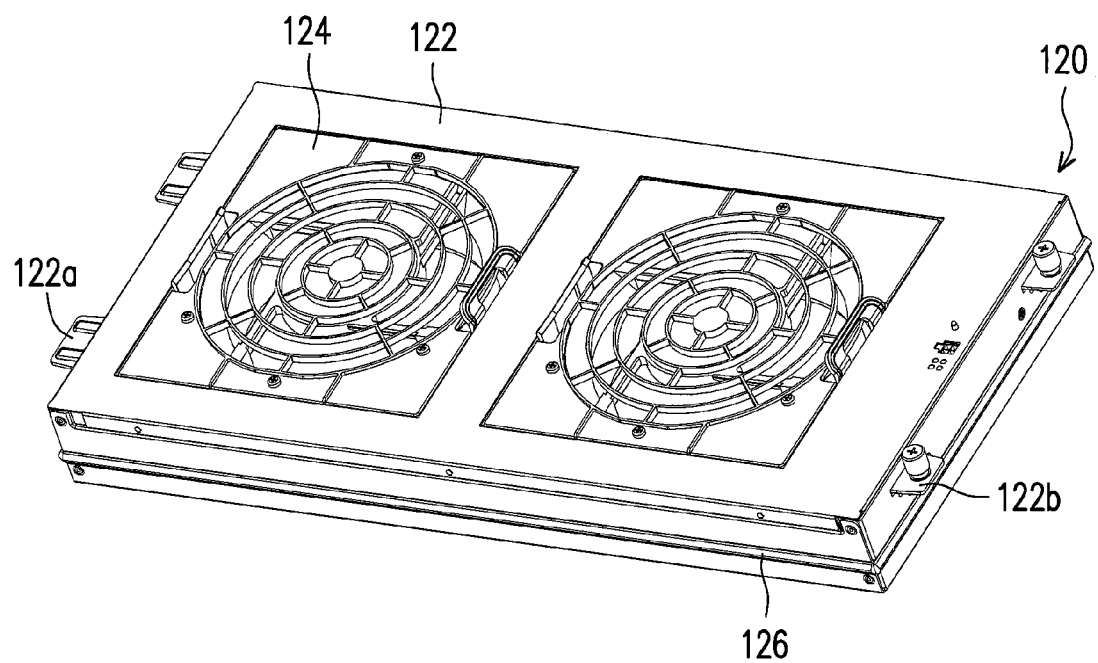
FIG. 2 is a three-dimensional view of a fan module of FIG. 1.

FIG. 2 is a three-dimensional view of a fan module of FIG. 1. Referring to FIG. 1 and FIG. 2, the rack body 110 has a plurality of position-limiting slots 110c at the back side 110b. One end of each of the fan cases 122 has a plurality of lugs 122a (only two lugs are schematically illustrated), and another end thereof has a plurality of connector tabs 122b (only two connector tabs are schematically illustrated). Each of the lugs 122a is inserted into the corresponding position-limiting slot 110c along a direction D2 parallel to the back side 110b, and each of the connector tabs 122b is fixed to the rack body 110 along a direction D3 perpendicular to the back side 110b in a screw-lock manner, so as to stably assemble the fan cases 122 to the rack body 110. Moreover, in the present embodiment, each of the fan modules 120 further includes a plurality of sealing strips 126, which are disposed at periphery of the fan case 122 to seal fissures between the fan case 122 and the rack body 110, so as to achieve effects of dust-proof and improving efficiency of a cooling airflow. A material of the sealing strip 126 is, for example, rubber or other suitable flexible materials, which is not limited by the invention.

Figure 3:
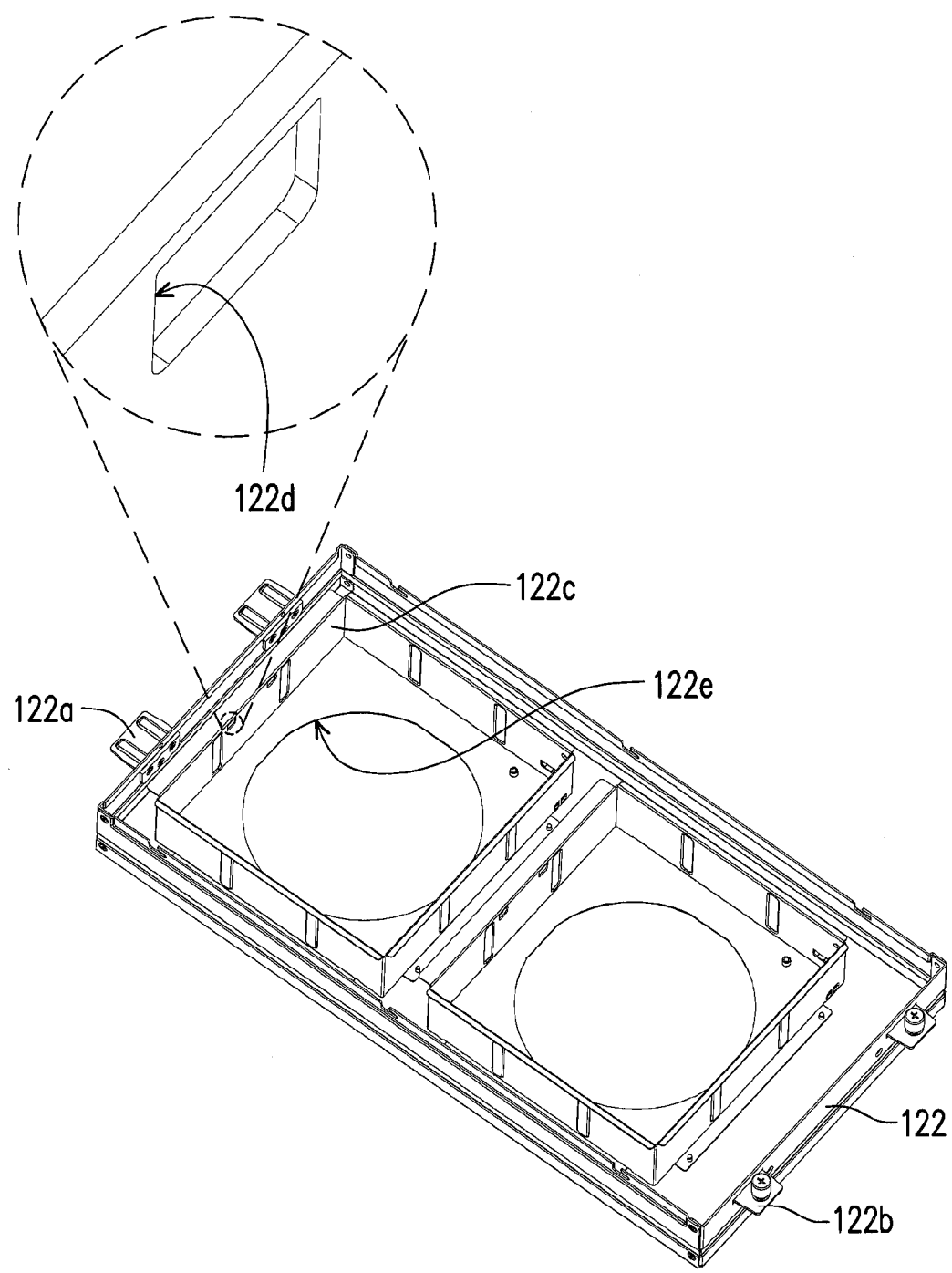
FIG. 3 is a three-dimensional view of a part of components of a fan module of FIG. 2.
Figure 4:
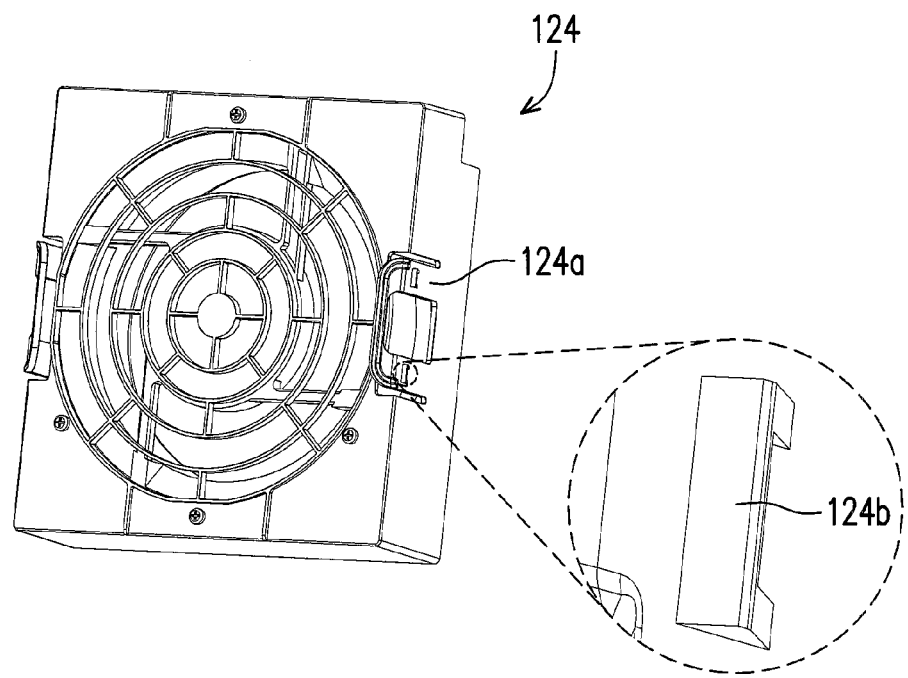
FIG. 4 is a three-dimensional view of a fan unit of FIG. 2.

FIG. 3 is a three-dimensional view of a part of components of a fan module of FIG. 2, and FIG. 4 is a three-dimensional view of a fan unit of FIG. 2. Referring to FIG. 2 to FIG. 4, in the present embodiment, each of the fan cases 122 has a plurality of containing recesses or cavities 122c (only two recesses or cavities are schematically illustrated), and the fan units 124 are respectively disposed for retention in the containing concaves 122c. Moreover, each of the fan units 124 has a resilient elastic piece 124a (only two elastic pieces are schematically illustrated), the fan unit 124 is position-limited in the containing recess or cavity 122c through a structural interference between the elastic piece 124a and the fan case 122, and the elastic piece 124a is adapted to be deformed due to an external force to release the structural interference between the elastic piece 124a and the fan case 122, so that the fan unit 124 is adapted to be detached from the fan case 122. In detail, the containing recess or cavity 122c of FIG. 3 has a locking slot 122d, the elastic piece 124a of FIG. 4 has a bump 124b, and the bump 124b is adapted to be buckled to the locking slot 122d to form the structural interference between the elastic piece 124a and the fan case 122, so as to stably fix the fan unit 124.

Figure 5:
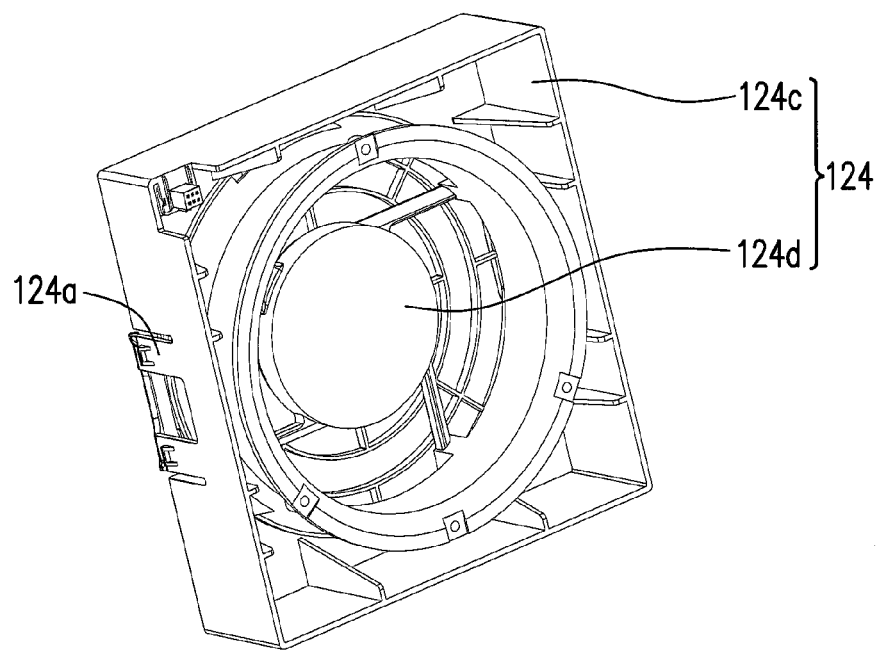
FIG. 5 is a three-dimensional view of the fan unit of FIG. 4 viewed from another viewing angle.

FIG. 5 is a three-dimensional view of the fan unit of FIG. 4 viewed from another viewing angle. Referring to FIG. 5, in the present embodiment, each of the fan units 124 is composed of a casing 124c and a fan body 124d. The casing 124c is detachably assembled to the fan case 122, and the fan body 124d is disposed in the casing 124c for providing a cooling airflow. The elastic piece 124a of FIG. 4 is connected to the casing 124c to serve as a lifting portion of the casing 124c, and after the elastic piece 124a is deformed due to an external force to release the structural interference between the elastic piece 124a and the fan case 122, the user can exert a force on the elastic piece 124a along the direction D1 shown in FIG. 1 to drive the casing 124c to detach from the fan case 122 along the direction D1.

Figure 6:
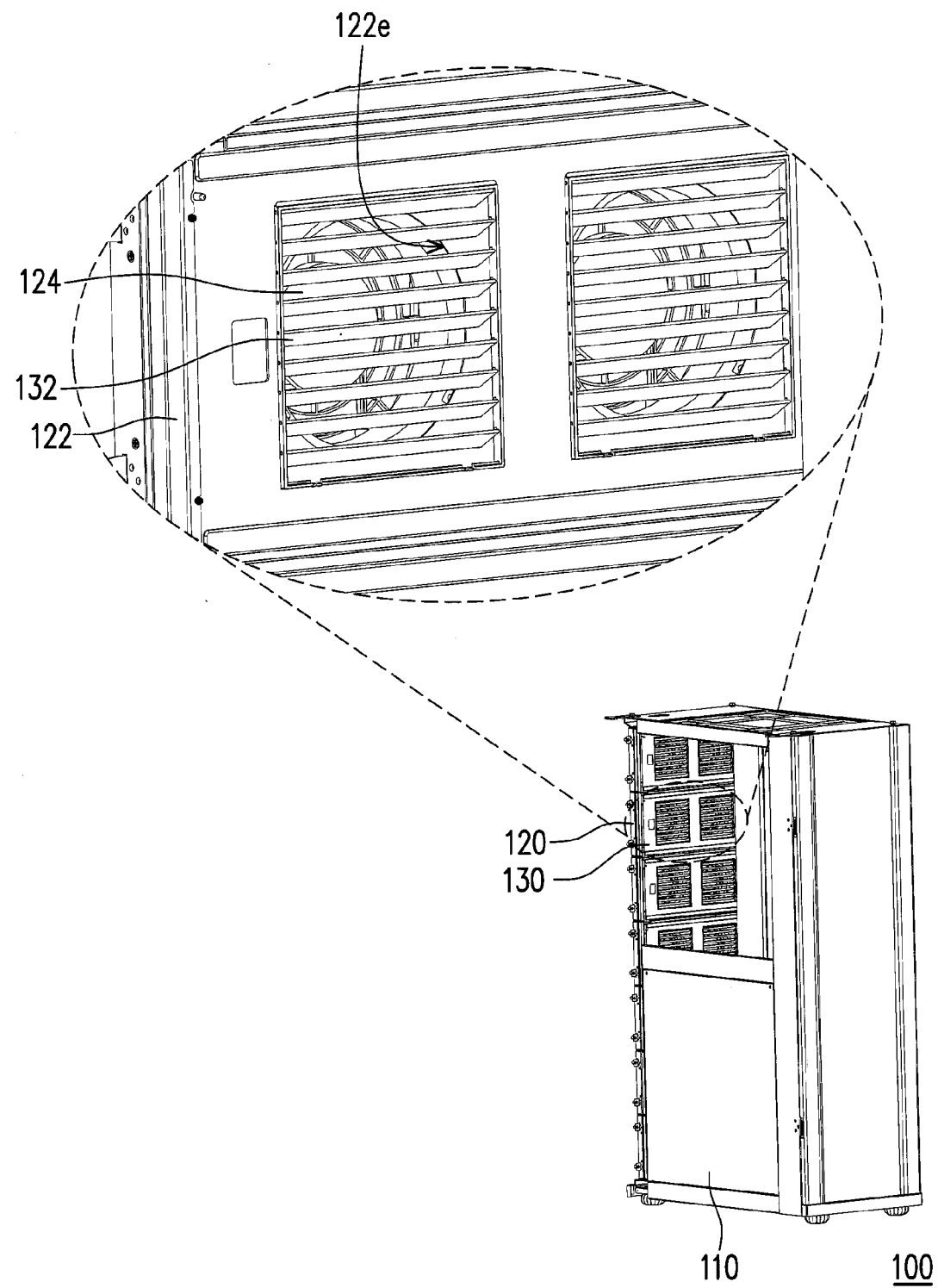
FIG. 6 is a three-dimensional view of a part of components of the server rack of FIG. 1 viewed from another viewing angle.
Figure 7:
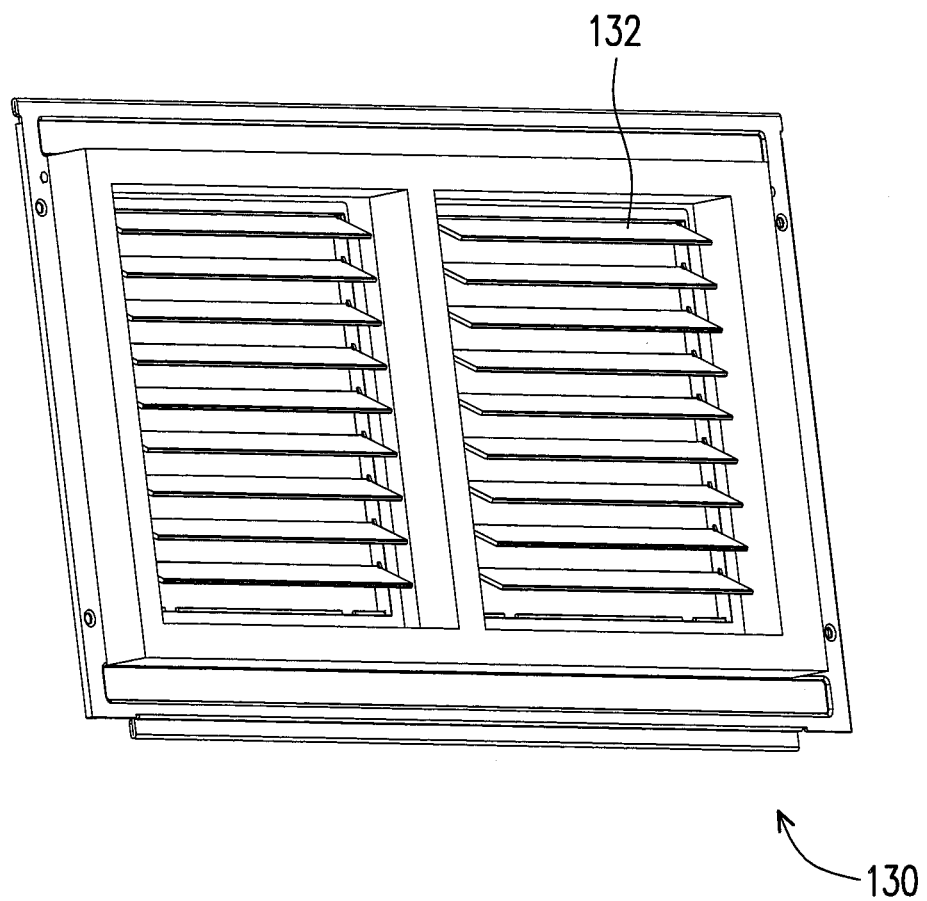
FIG. 7 is a three-dimensional view of active flap devices of FIG. 6 viewed from another viewing angle.

FIG. 6 is a three-dimensional view of a part of components of the server rack of FIG. 1 viewed from another viewing angle. FIG. 7 is a three-dimensional view of active flap devices of FIG. 6 viewed from another viewing angle. Referring to FIG. 6 and FIG. 7, the server rack 100 further includes a plurality of active flap devices 130. The active flap devices 130 are respectively assembled to the fan cases 122 to face to internal of the rack body 110. As shown in FIG. 3 and FIG. 6, each of the fan cases 122 has a plurality of air outlets 122e (only two air outlets are schematically illustrated), and the air outlets 122e are respectively aligned to the fan units 124, and the active flap devices 130 respectively correspond to the air outlets 122e. Each of the active flap devices 130 shown in FIG. 6 and FIG. 7 is, for example, in the form of a shutter, and a plurality of flaps 132 is adapted to be opened and closed to expose the corresponding air outlet 122e or shield the corresponding air outlet 122e (exposure of the air outlet 122e is illustrated). When the fan unit 124 is not used, the active flap device 130 is closed to shield the air outlet 122e, so as to prevent external dust or foreign matters from entering the internal of the server rack 100 through the air outlet 122e.

Figure 8:
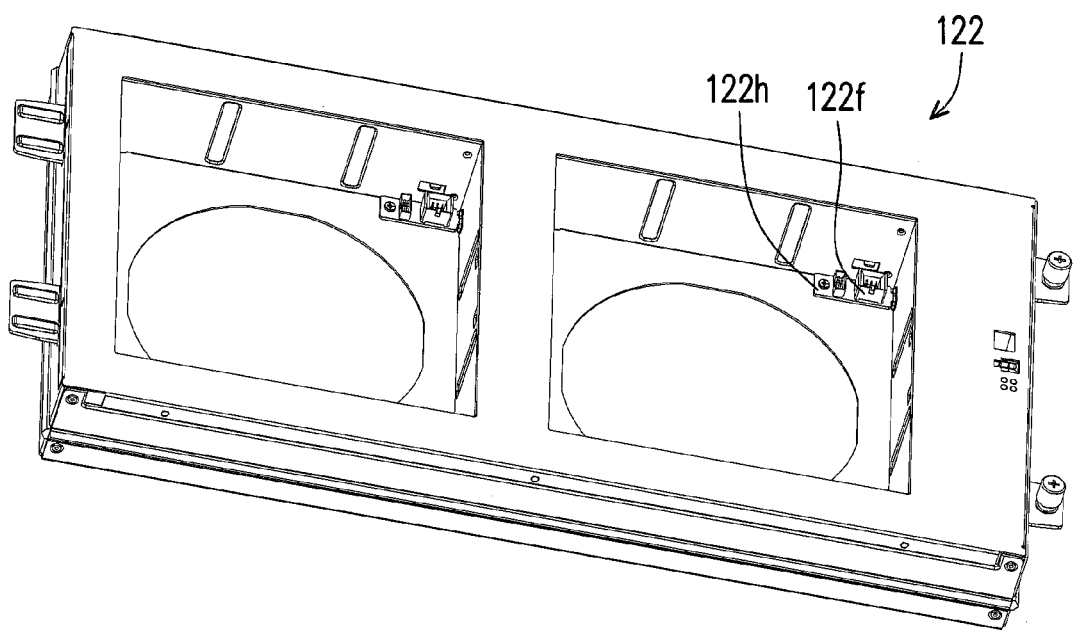
FIG. 8 is a three-dimensional view of a fan case of FIG. 2.
Figure 9:
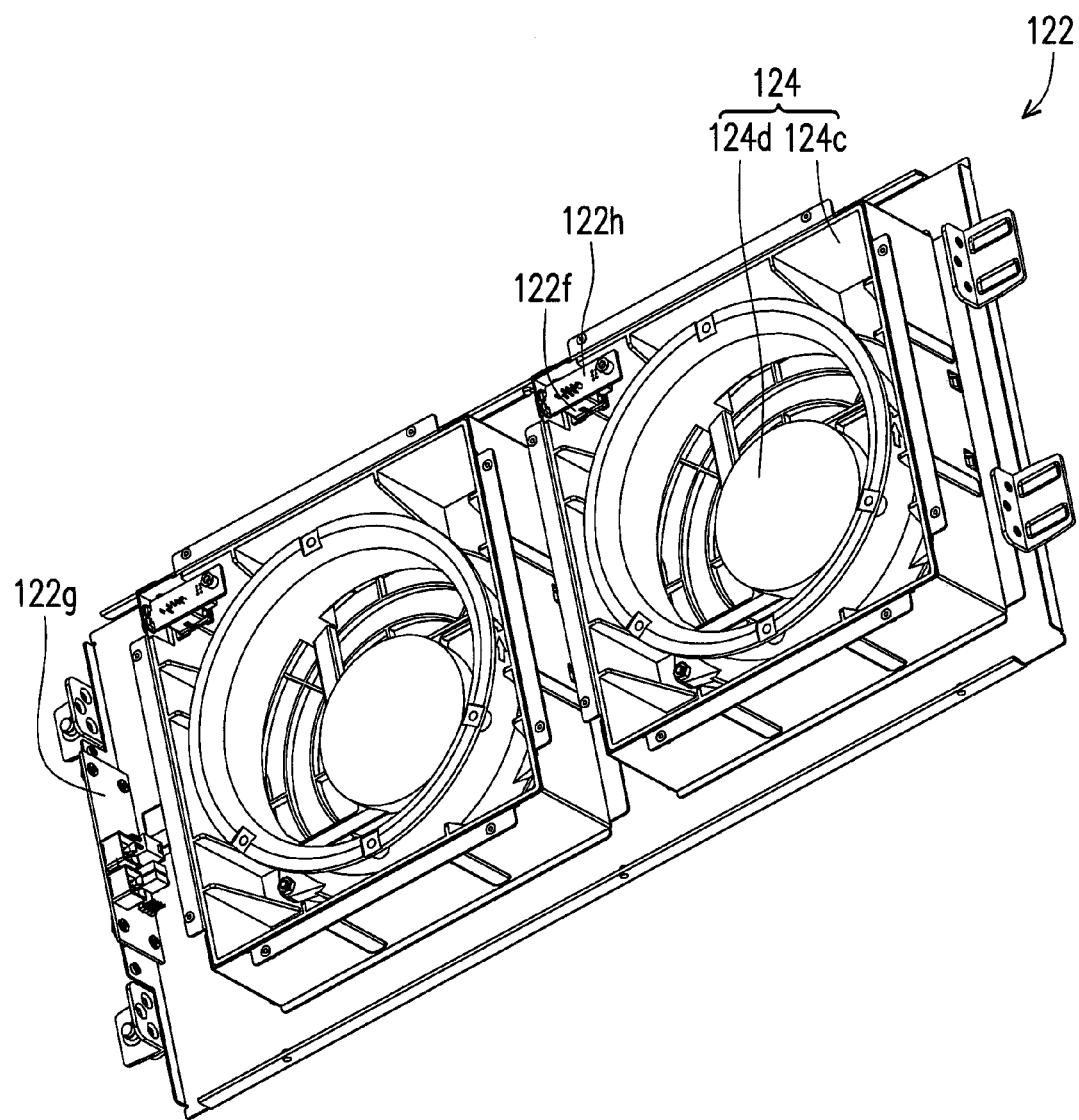
FIG. 9 is a three-dimensional view of a part of components of a fan unit and a fan case of FIG. 2 viewed from another viewing angle.
Figure 10:
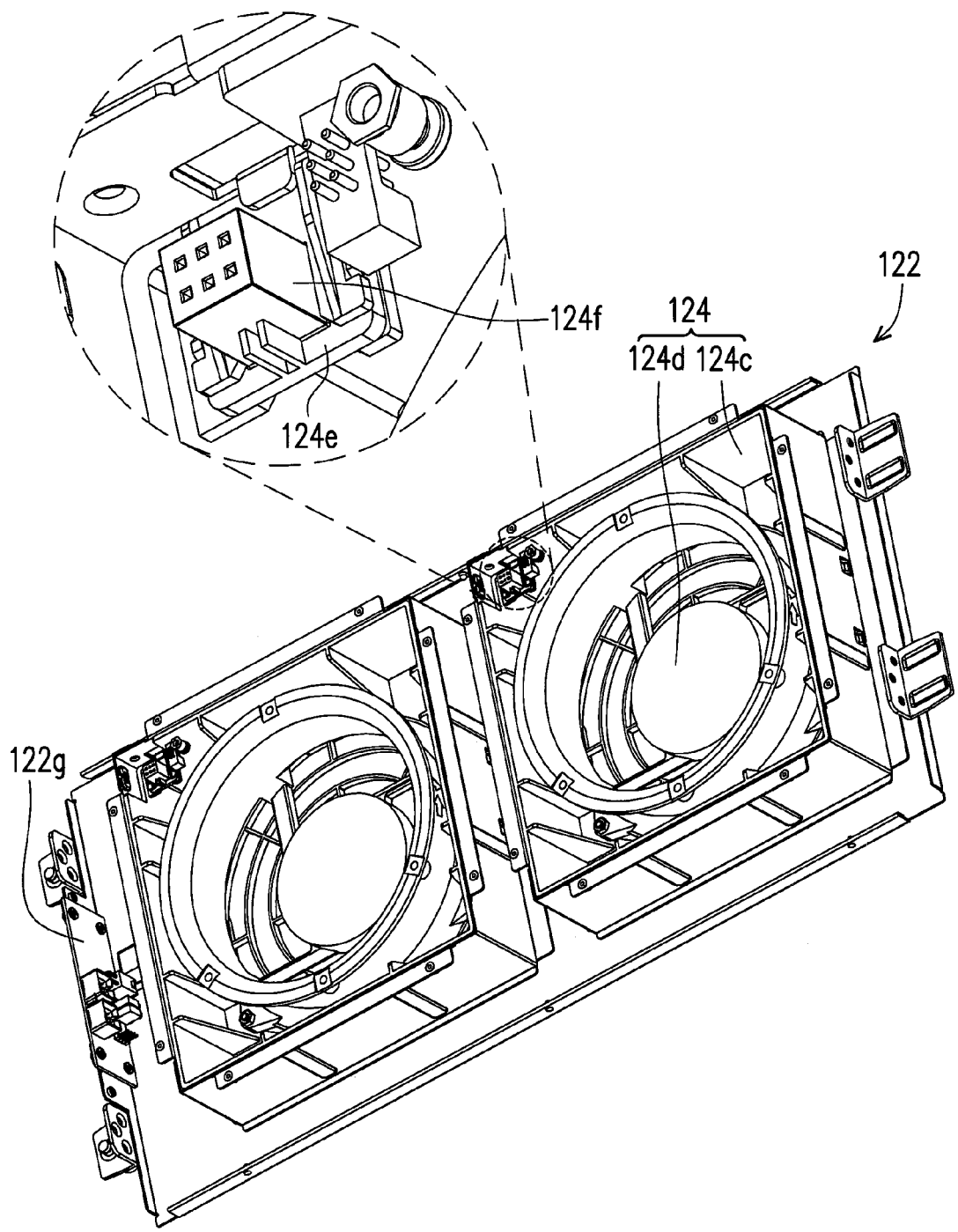
FIG. 10 is a three-dimensional view of a part of components of the fan unit and the fan case of FIG. 8.

FIG. 8 is a three-dimensional view of the fan case of FIG. 2. FIG. 9 is a three-dimensional view of a part of components of the fan unit and the fan case of FIG. 2 viewed from another viewing angle. FIG. 10 is a three-dimensional view of a part of components of the fan unit and the fan case of FIG. 8. For clarity's sake, a first connector 122f in FIG. 8 is not illustrated in FIG. 10. Referring to FIG. 8 to FIG. 10, in the present embodiment, the fan case 122 has a first circuit board 122g, two second circuit boards 122h and two first connectors 122f. The first connectors 122f are respectively disposed on the second circuit boards 122h. The casing 124c has a connector mounting shelf 124e and a second connector 124f, and the second connector 124f is fixed to the connector mounting shelf 124e. The casing 124c is suitable for being detached from the fan case 122 along the direction D1 shown in FIG. 1, or being assembled to the fan case 122 along the direction D1' so that the second connector 124f is connected to the first connector 122f along the direction D1', and each of the fan units 124 is independently assembled to the fan case 122 along the direction D1' and is electrically connected to the corresponding second circuit board 122h independently. The first circuit board 122g is adapted to be electrically connected to the rack body 110 of FIG. 1 for communicating with the rack body 110 and generating a communication signal. The second circuit boards 122h are electrically connected to the first circuit board 122g for receiving the communication signal of the first circuit board 122g.

In summary, the fan case is detachably assembled to the back side of the rack body and is electrically connected to the rack body independently, and each of the fan units is detachably assembled to the fan case and is electrically connected to the fan case independently. In this way, the fan case can be independently detached from the rack body to implement hot-plugging, and each of the fan units can be independently detached from the fan case to implement hot-plugging. When the fan case or the fan unit is independently detached or hot-plugged, operations of the other fan units are not influenced, so that assembling/disassembling and maintenance convenience are improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A server rack, comprising:
    a rack body, having a front side and a back side opposite to each other, wherein a plurality of server units are disposed in the rack body; and
    a plurality of fan modules, arranged on the back side along a vertical direction, wherein each of the fan modules is aligned to several of the server units and comprises:
        a fan case, detachably assembled to the back side of the rack body, wherein the fan case is at least in part assembled to the back side of the rack body in a second direction perpendicular to the back side and electrically connected to the rack body independently of others of the fan modules and suitable for being detached from the rack body independently of the others of the fan modules; and
        a plurality of fan units, detachably assembled to the fan case while the fan case is assembled to the back side of the rack body and the fan units are arranged on the fan case along a horizontal direction, wherein each of the fan units is electrically connected to the fan case independently of others of the fan units and suitable for being independently detached from the fan case along a first direction perpendicular to the back side or being independently assembled to the fan case along the second direction opposite to the first direction.

2. The server rack as claimed in claim 1, wherein each of the fan cases has a plurality of retaining recesses or cavities, and the fan units are respectively disposed for retention in the containing recesses or cavities.

3. The server rack as claimed in claim 2, wherein each of the fan units has an elastic piece, the fan unit is position-limited in the containing recess or cavity through a structural interference between the elastic piece and the fan case, and the elastic piece is adapted to be deformed due to an external force to release the structural interference between the elastic piece and the fan case, so that the fan unit is adapted to be detached from the fan case.

4. The server rack as claimed in claim 3, wherein each containing recess or cavity has a locking slot, the elastic piece has a bump, and the bump is buckled to the locking slot to form the structural interference between the elastic piece and the fan case.

5. The server rack as claimed in claim 1, wherein one end of each of the fan cases has a plurality of lugs, and another end thereof has a plurality of connector tabs, each of the lugs is inserted into the rack body along a direction parallel to the back side, and each of the connector tabs is fixed to the rack body.

6. The server rack as claimed in claim 5, wherein the rack body has a plurality of position-limiting slots at the back side, and each of the lugs is inserted into the corresponding position-limiting slot along the direction parallel to the back side.

7. The server rack as claimed in claim 5, wherein each of the connector tabs is fixed to the rack body along the second direction perpendicular to the back side.

8. The server rack as claimed in claim 1, wherein each of the fan units comprises:
    a casing, detachably assembled to the fan case; and
    a fan body, disposed in the casing.

9. The server rack as claimed in claim 8, wherein the fan case has a plurality of first connectors, the casing has a connector mounting shelf and a second connector, the second connector is fixed to the connector mounting shelf, the casing is suitable for being detached from the fan case along the first direction, or being assembled to the fan case along the second direction so that the second connector is connected to the first connector along the second direction.

10. The server rack as claimed in claim 8, wherein the casing has a lifting portion, and the lifting portion is suitable for being stressed along the first direction to drive the casing to detach from the fan case along the first direction.

11. The server rack as claimed in claim 1, wherein each of the fan modules further comprises a plurality of sealing strips disposed at periphery of the fan case to seal fissures between the fan case and the rack body.

12. The server rack as claimed in claim 1, further comprising a plurality of active flap devices, wherein the active flap devices are respectively assembled to the fan case to face to internal of the rack body.

13. The server rack as claimed in claim 12, wherein each of the fan cases has a plurality of air outlets, and the air outlets are respectively aligned to the fan units, the active flap devices respectively correspond to the air outlets, and each of the active flap devices is suitable for being opened and closed to expose the corresponding air outlet or shield the corresponding air outlet.

14. The server rack as claimed in claim 1, wherein the fan case comprises:
    a first circuit board, electrically connected to the rack body, and communicating with the rack body and generating a communication signal; and
    two second circuit boards, electrically connected to the first circuit board, and receiving the communication signal of the first circuit board, wherein when each of the fan units is independently mounted to the fan case along the second direction, and each of the fan units is independently electrically connected to the corresponding second circuit board along the second direction.

* * * * *